United States Patent
Trottier et al.

(10) Patent No.: US 8,704,254 B2
(45) Date of Patent: Apr. 22, 2014

(54) LIGHT EMITTING DEVICE INCLUDING A FILTER

(75) Inventors: Troy A. Trottier, San Jose, CA (US); Matthijs H. Keuper, San Jose, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 1257 days.

(21) Appl. No.: 11/615,291

(22) Filed: Dec. 22, 2006

(65) Prior Publication Data

US 2008/0179609 A1 Jul. 31, 2008

(51) Int. Cl.
*H01L 33/00* (2010.01)

(52) U.S. Cl.
USPC ............ 257/98; 257/E33.001; 438/29

(58) Field of Classification Search
USPC ............... 257/98, E33.001; 438/29
See application file for complete search history.

(56) References Cited

U.S. PATENT DOCUMENTS

| | | | |
|---|---|---|---|
| 5,813,752 A | 9/1998 | Singer et al. | |
| 5,952,681 A | 9/1999 | Chen | |
| 6,340,824 B1 | 1/2002 | Komoto et al. | |
| 6,351,069 B1 | 2/2002 | Lowery et al. | |
| 6,576,488 B2 | 6/2003 | Collins, III et al. | |
| 6,623,142 B1* | 9/2003 | Lippmann et al. | 362/293 |
| 6,630,691 B1 | 10/2003 | Mueller-Mach et al. | |
| 6,650,044 B1 | 11/2003 | Lowery | |
| 6,696,703 B2 | 2/2004 | Mueller-Mach et al. | |
| 6,744,077 B2 | 6/2004 | Trottier et al. | |
| 7,026,663 B2 | 4/2006 | Krames et al. | |
| 7,196,354 B1* | 3/2007 | Erchak et al. | 257/79 |
| 2004/0046178 A1 | 3/2004 | Sano | |
| 2004/0069992 A1* | 4/2004 | Lin et al. | 257/79 |
| 2005/0164899 A1 | 7/2005 | Tang et al. | |
| 2005/0269582 A1 | 12/2005 | Mueller et al. | |
| 2006/0237541 A1* | 10/2006 | Downing | 235/462.01 |
| 2006/0258028 A1 | 11/2006 | Paolini et al. | |

FOREIGN PATENT DOCUMENTS

EP 1403934 A2 3/2004

OTHER PUBLICATIONS

Robert Vestberg, "Dendron Decorated Chromophores for Optical Power Limiting Applications," KTH fibre and Polymer Technology, pp. 1-73.
International Search Report and Written Opinion, 15 pages.

\* cited by examiner

*Primary Examiner* — Thao X Le
*Assistant Examiner* — Matthew Gordon

(57) ABSTRACT

A semiconductor structure includes a light emitting region disposed between an n-type region and a p-type region. A wavelength converting material configured to absorb a portion of the first light emitted by the light emitting region and emit second light is disposed in a path of the first light. A filter is disposed in a path of the first and second light. In some embodiments, the filter absorbs or reflects a fraction of first light at an intensity greater than a predetermined intensity. In some embodiments, the filter absorbs or reflects a portion of the second light. In some embodiments, a quantity of filter material is disposed in the path of the first and second light, then the CCT of the first and second light passing through the filter is detected. Filter material may be removed to correct the detected CCT to a predetermined CCT.

6 Claims, 2 Drawing Sheets

US 8,704,254 B2

LIGHT EMITTING DEVICE INCLUDING A FILTER

BACKGROUND

1. Field of Invention

This invention relates to semiconductor light emitting devices including a filter.

2. Description of Related Art

Semiconductor light emitting devices such as light emitting diodes (LEDs) are among the most efficient light sources currently available. Material systems currently of interest in the manufacture of high brightness LEDs capable of operation across the visible spectrum include group III-V semiconductors, particularly binary, ternary, and quaternary alloys of gallium, aluminum, indium, and nitrogen, also referred to as III-nitride materials; and binary, ternary, and quaternary alloys of gallium, aluminum, indium, arsenic, and phosphorus. Often III-nitride devices are epitaxially grown on sapphire, silicon carbide, or III-nitride substrates and III-phosphide devices are epitaxially grown on gallium arsenide by metal organic chemical vapor deposition (MOCVD) molecular beam epitaxy (MBE) or other epitaxial techniques. Often, an n-type region is deposited on the substrate, then an active region is deposited on the n-type region, then a p-type region is deposited on the active region. The order of the layers may be reversed such that the p-type region is adjacent to the substrate.

The color of light emitted from a semiconductor light emitting device chip such as a light emitting diode may be altered by placing a wavelength-converting material in the path of the light exiting the chip. The wavelength-converting material may be, for example, a phosphor. Phosphors are luminescent materials that can absorb an excitation energy (usually radiation energy) and store this energy for a period of time. The stored energy is then emitted as radiation of a different energy than the initial excitation energy. For example, "down-conversion" refers to a situation where the emitted radiation has less quantum energy than the initial excitation radiation. The energy wavelength effectively increases, shifting the color of the light towards red.

A common method of making a light emitting device that emits white light is to combine a phosphor such as $Y_3Al_5O_{12}$: $Ce^{3+}$ that emits yellow light with a blue LED chip that emits blue light. The combination of yellow phosphor-converted light and unconverted blue light leaking through the phosphor layer appears white. The color characteristics of the combined light are controlled by selecting only LEDs that emit blue light of a particular wavelength, and by varying the thickness of the phosphor layer to control the amount of leakage of blue light and the amount of phosphor conversion. This approach is inefficient in that large numbers of LEDs which emit blue light at a wavelength outside the desired range are unusable, and results in large variations in the correlated color temperature (CCT) of the light since it is difficult to precisely control the amount of blue leakage and phosphor conversion. The CCT of phosphor converted LEDs sold today may vary from 5500K to 8500K. Discernable color differences are dependent on the CCT of the combined light. At 6500K, differences as small as 300K are apparent to the viewer. The large variation in CCT between parts is unacceptable for many applications.

SUMMARY

In accordance with embodiments of the invention, a semiconductor structure including a light emitting region disposed between an n-type region and a p-type region is provided. The light emitting region is configured to emit first light, blue light in some embodiments. A wavelength converting material configured to absorb a portion of the first light and emit second light, yellow light in some embodiments, is disposed in a path of the first light. A filter is disposed in a path of the first and second light. In some embodiments, the filter absorbs or reflects a fraction of first light at an intensity greater than a predetermined intensity. In some embodiments, the filter absorbs or reflects a portion of the second light. In some embodiments, a quantity of filter material is disposed in the path of the first and second light, then the CCT of the first and second light passing through the filter is detected. More filter material may be added or filter material may be removed to correct the detected CCT to a predetermined CCT.

Filters according to embodiments of the invention may be used to correct the CCT of white light formed by combining a blue-emitting semiconductor light emitting device with a yellow-emitting phosphor.

DETAILED DESCRIPTION

In accordance with embodiments of the invention, a light emitting device includes a filter for filtering out any undesired light from the spectrum emitted by the device. The use of a filter may offer improved control over the CCT of the combined light emitted by a phosphor converted semiconductor light emitting device.

The CCT of the combined light emitted by a blue-emitting light emitting device combined with a yellow-emitting phosphor can be altered by altering the wavelength of the blue light emitted by the device, the amount of blue light in the combined light, and the amount of yellow light in the combined light.

Figure 1:
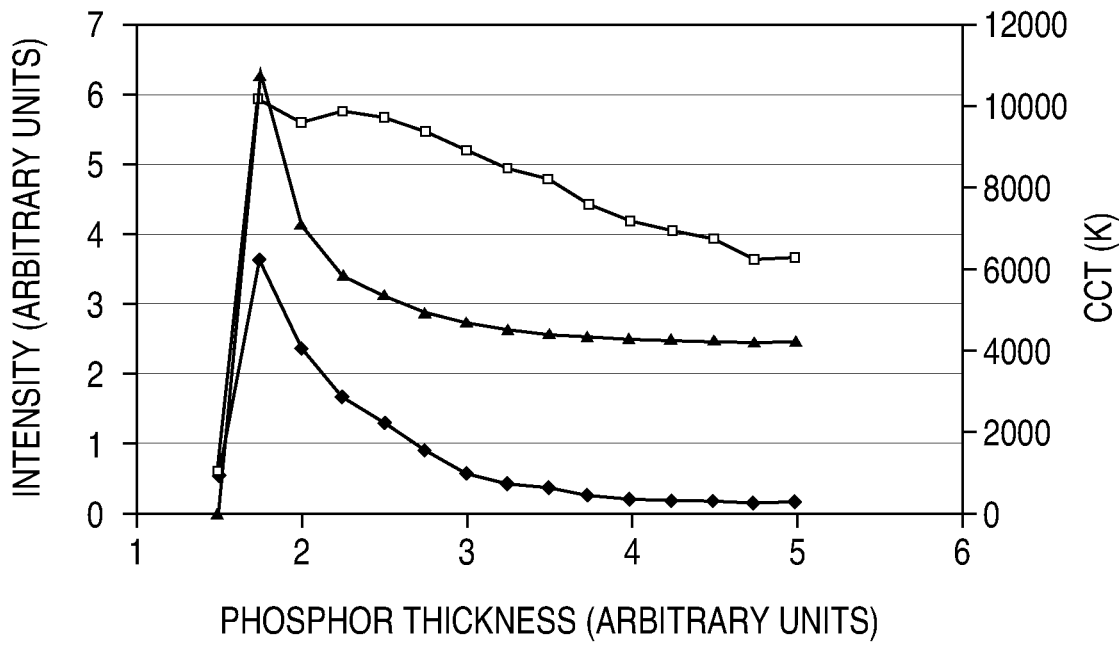
FIG. 1 is a plot of intensity and CCT as a function of phosphor thickness for the blue and yellow light emitted in a device combining a blue-emitting LED with a yellow-emitting phosphor.

In some embodiments, the filter material alters the CCT of the combined light by capping the amount of blue light in the combined light. The inventors have observed that the intensity of light emitted by the phosphor varies linearly with phosphor thickness, while the intensity of unconverted light leaking through the phosphor varies exponentially with phosphor thickness. FIG. 1 is a plot of intensity and CCT as a function of phosphor layer thickness for both blue (diamonds in FIG. 1) and yellow (squares in FIG. 1) light in a phosphor converted light emitting device. The triangles illustrate the CCT of the combined light. As illustrated in FIG. 1, as the phosphor thickness increases, the intensity of yellow light in the combined light drops linearly. As the phosphor thickness increases, the intensity of blue light in the combined light drops exponentially. The nonlinear relationship between phosphor thickness and blue light intensity makes targeting the desired intensity of blue light particularly difficult.

Figure 2:
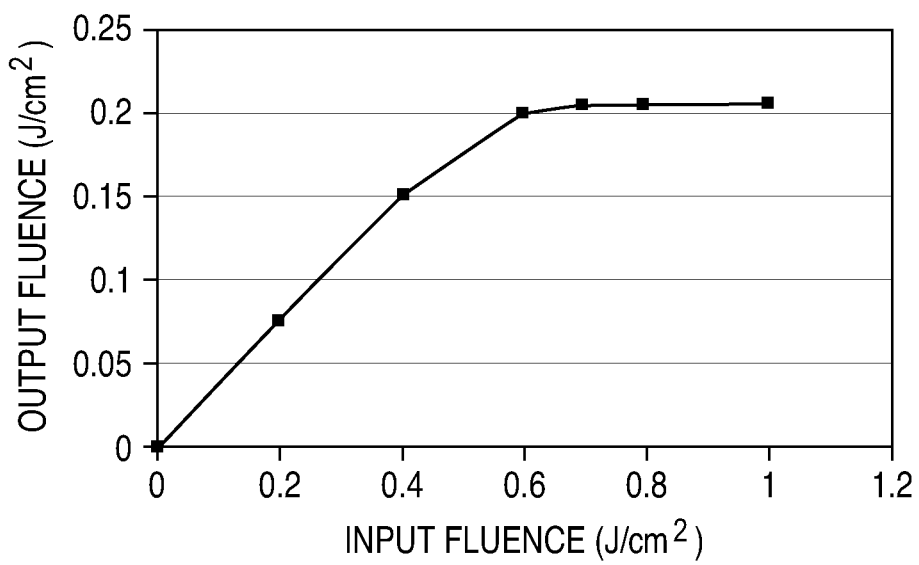
FIG. 2 is a plot of output fluence as a function of input fluence for a filter material according to embodiments of the invention.

FIG. 2 illustrates the behavior of a filter material capable of capping the intensity of blue light. FIG. 2 is a plot of output fluence as a function of input fluence for a filter material. The filter material illustrated in FIG. 2 is transparent below a given input intensity threshold. Once the input intensity threshold is reached, the filter material becomes opaque to any light beyond the intensity threshold. Thus, the filter material caps the intensity of blue light emitted from the device at the threshold level, often by a process referred to as reverse saturable absorption.

Appropriate filter materials capable of capping the intensity of blue light at a given threshold level may be organic or inorganic and include fullerenes, hydrothermal zinc-oxide crystals, and dendron decorated porphyrins.

The wavelength-converting layer of a device employing a filter material capable of capping the intensity of blue light at a given threshold level may be designed such that the wavelength converting layer operates at peak efficiency, regardless of the amount of blue light leakage through the wavelength-converting layer. In general, the efficiency of phosphor-converted light emitting devices, in terms of lumens of light extracted per unit of electrical power supplied, increases as the amount of blue light leaking through the phosphor layer increases, both because the phosphor more efficiently generates light at lower absorption and because the phosphor layer is thinner such that less light is lost to backscattering and later absorption by the phosphor layer or the semiconductor device. In such a device with a thin phosphor layer that permits significant leakage of blue light, a filter material capable of capping the intensity of blue light at a given threshold level may be used to remove excess, unwanted blue light from the spectrum, such that the combined light transmitted by the filter material has the desired CCT.

A filter material capable of capping the intensity of blue light at a given threshold level may also be used to linearize the relationship between phosphor layer thickness and intensity of blue light leaking through the phosphor shown in FIG. 1. When such a filter material is used, the CCT of the combined light can be more readily controlled by the thickness of the phosphor layer, since the blue light intensity and therefore the CCT is less sensitive to small variations in phosphor layer thickness when the relationship between phosphor layer thickness and blue light intensity is linear, rather than exponential.

In some embodiments, the filter material alters the CCT of the combined light by altering the wavelength of the blue light or by altering the relative amounts of blue and yellow light in the combined light. In such embodiments, the filter material may be one or more dyes or pigments disposed in a transparent material. In some examples, the filter material includes one or more inorganic pigments, which are generally stable at high heat and high flux from the light emitting device. Suitable pigments may include Bayferrox® or chrome oxide pigments available from Lanxess, or Heucodur® pigments available from Heubach. The thickness of the filter material layer and the concentration of dye or pigment in the layer determines how much light is absorbed. In some embodiments, the filter layer is configured to limit absorption by the filter. For example, the filter may be configured to transmit at least 50% of light incident on the filter, more preferably at least 70% of light incident on the filter. In contrast, a typical filter designed to isolate red, green, or blue light in an RGB display generally transmits only 30% of light incident on the filter.

In one example, once the wavelength converting material is disposed over the device, the CCT of the combination of wavelength-converted light and unconverted light from the device is measured, then the required types and amounts of pigment are calculated. A filter layer with the required amounts and types of pigments is then formed, for example by ink jet printing. Such a process can be performed on individual devices, but throughput would be increased by performing the process in batches. For example, the CCTs may be measured and filter layers formed prior to singulating the individual semiconductor devices in a wafer, or prior to singulating a wafer of mounts on which individual semiconductor devices are disposed.

In another example, the filter layer is initially formed too thick to produce the desired CCT. The CCT of the device is measured for the first time after forming the filter layer, then filter material is removed in a controlled fashion to produce the desired CCT. Alternatively, a filter layer may be initially formed too thin to produce the desired CCT, then the CCT measured, and additional filter material added in a controlled fashion to produce the desired CCT.

In either of the above examples, the CCT may be measured multiple times and filter material added or removed after each measurement until the desired CCT is reached.

A computer controlled laser trimming process may be used to ablate the filter material to produce the desired CCT. Where the devices are tested in batches, the computer controlled laser can ablate the filter layer on each device by an amount specifically tailored for that device depending on the individual CCT for that device.

Each device may be tested and the filter material removed in an iterative process, or, once the system is calibrated, i.e., the amount of filter material that must be removed to produce a specific change in CCT is known, each device can be measured once and the appropriate amount of filter material removed. Depending on the amount of material to be removed, it may be necessary to ablate the filter material using multiple passes, where each pass only removes a small amount of material. The use of multiple passes reduces the risk of charring the resin in the filter material if it is removed with a laser.

Laser ablation may involve removing a series of lines or spots of filter material, such that the thickness of the filter material layer after ablation is thinner in some regions and thicker in some regions, rather than uniformly reduced over the entire extent of the filter material. In one embodiment, there may be a reduction in thickness at one location and an increase in thickness at another location corresponding to a single device. The filter material may be partially or completely removed in localized areas such that the average thickness of the filter material is reduced despite the thickness of the filter material in some regions remaining unchanged. Patterns other than lines and spots may be used to alter the thickness of the wavelength converting member.

A spatial map of the CCT may be generated when the CCT of each device is measured. The spatial map of the CCT may be provided to the computer control and high spots on the filter material may be ablated, so not only is the desired CCT obtained, but also the CCT is made more spatially uniform.

Processes other than laser ablation may be used to remove the filter material. For example, the filter material may be removed using techniques such as mechanical and/or chemical etching, ion beam, or electron beam ablation.

The filters described above may be used with any suitable configuration of light emitting device and with any suitable configuration of wavelength converting layers. It is to be understood that the invention is not limited to the materials, device orientations, or other details discussed in the examples below. For example, the embodiments of the invention may be applied to any suitable light emitting device materials system, including for example III-V materials, III-nitride materials, III-phosphide materials, and II-VI materials. Embodiments of the invention may be applied to any device geometry, including thin film devices from which the growth substrate has been removed, devices with contacts on opposite sides of the semiconductor layers and devices with contacts on the same side of the semiconductor layers, such as flip chips where light is extracted through a substrate, and epitaxy-up structures where light is extracted through the contacts. Embodiments of the invention may be applied to any type of wavelength converting layer, including wavelength converting materials disposed in resins as described in U.S. Pat. No. 6,351,069; single crystal luminescent substrates on which the light emitting device layers are grown, as described in U.S. Pat. No. 6,630,691; thin film phosphor layers as described in U.S. Pat. No. 6,696,703; and conformal layers deposited by electrophoretic deposition as described in U.S. Pat. No. 6,576,488 or stenciling as described in U.S. Pat. No. 6,650,044; and luminescent ceramic layers as described in U.S. Published Patent Application 2005-0269582. Each of U.S. Pat. Nos. 6,630,691, 6,696,703, 6,576,488, and 6,650,044, as well as U.S. Published Patent Application 2005-0269582, is incorporated herein by reference.

Further, the particular configurations of filter materials are not limited to the particular configurations of wavelength converting materials or semiconductor light emitting devices with which they are shown in the embodiments described below. Any appropriate filter configuration, wavelength converting layer configuration, and device configuration may be combined according to embodiments of the invention.

Figure 3:
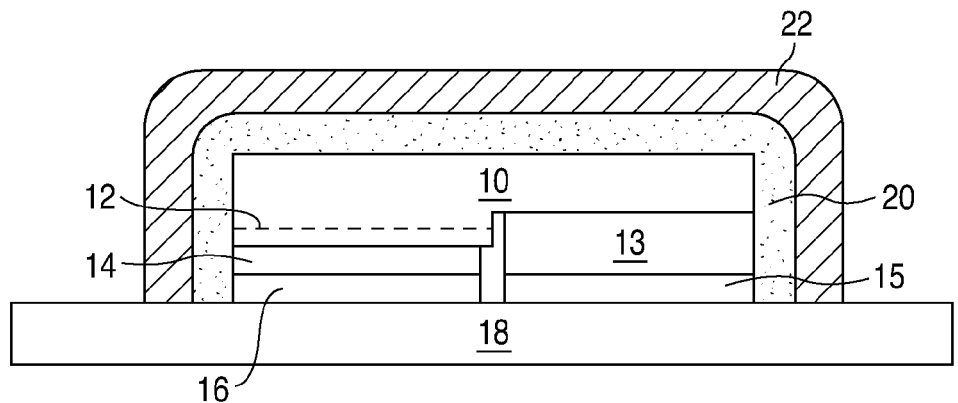
FIG. 3 illustrates a conformal wavelength converting layer and a conformal filter layer disposed over a flip chip mounted thin film semiconductor light emitting device.

FIGS. 3-6 illustrate examples of suitable configurations of semiconductor light emitting devices, wavelength converting layers, and filter layers. FIG. 3 illustrates a flip chip mounted III-nitride light emitting device from which the substrate has been removed, including a conformal wavelength converting layer and a conformal filter layer. A III-nitride semiconductor structure 10 includes a light emitting region 12 disposed between an n-type region and a p-type region. Each of the n-type region, light emitting region, and p-type region may include multiple layers of different compositions and dopant concentration. For example, the n- and p-type regions may include layers of opposite conductivity type or layers that are not intentionally doped, preparation layers such as buffer layers or nucleation layers, release layers designed to facilitate later release of the growth substrate or thinning of the semiconductor structure after substrate removal, and device layers designed for particular optical or electrical properties desirable for the light emitting region to efficiently emit light. The light emitting region may be a single thick or thin light emitting layer, or multiple thin quantum well layers separated by barrier layers of different composition.

After growth of semiconductor structure 10 on a growth substrate, a portion of the last-grown conductivity type region, often the p-type region, and the light emitting region are etched away to reveal the first-grown conductivity type region, often the n-type region. Metal contacts 13 and 14 are formed on the exposed portions of the n- and p-type regions. The semiconductor structure is electrically and physically connected to a mount 18 by n- and p-interconnects 15 and 16. After mounting on mount 18, the growth substrate (not shown in FIG. 3) may be removed by a process appropriate to the growth substrate material, such as laser melting or grinding for a sapphire substrate, or etching or grinding for a SiC or composite substrate. An underfill, which supports semiconductor structure 10 to prevent or reduce cracking during growth substrate removal, may be disposed in any open spaces between semiconductor structure 10 and mount 18 before, during, or after semiconductor structure 10 is connected to mount 18. The top surface of semiconductor structure 10 in the orientation shown in FIG. 3, which is exposed by growth substrate removal, may be thinned for example by photoelectrochemical etching, and may be roughened or textured with features such as a photonic crystal in order to enhance light extraction from semiconductor structure 10.

A conformal wavelength converting layer 20 is formed over the top and sides of semiconductor structure 10. Wavelength converting layer 20 may be, for example, a phosphor layer formed by electrophoretic deposition or stenciling. A conformal filter layer 22, which may include one or more of the filter materials described above, is formed over wavelength converting layer 20. Filter layer 22 may be formed by, for example, ink jet printing or stenciling a filter material disposed in a transparent carrier such as epoxy or silicone.

Figure 4:
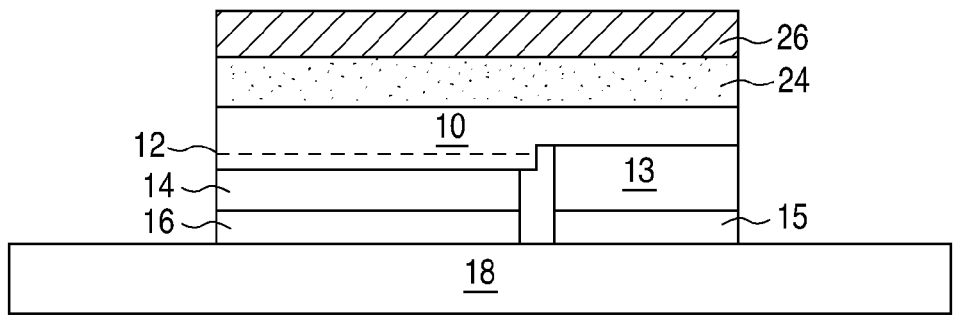
FIG. 4 illustrates a ceramic wavelength converting layer and a filter layer disposed over a flip chip mounted thin film semiconductor light emitting device.

FIG. 4 illustrates a flip chip mounted III-nitride light emitting device from which the growth substrate has been removed, including a ceramic wavelength converting layer and a filter layer. Semiconductor structure 10 is a thin film device flip chip mounted on mount 18 as described above in reference to FIG. 3. Wavelength converting layer 24 is a ceramic phosphor, disposed over the exposed top surface of semiconductor structure 10. Ceramic phosphor layer 24 may be attached to semiconductor structure 10 by, for example, an organic adhesive such as epoxy or silicone, one or more high index inorganic adhesives, or a sol-gel glass. Filter layer 26, which may include one or more of the filter materials described above, is formed over wavelength converting layer 24. Filter layer 26 may be formed by, for example, ink jet printing or may be a separately-fabricated member such as a filter material disposed in glass, silicone, or other transparent solid, which is attached to ceramic phosphor layer 24 by, for example, an organic adhesive such as epoxy or silicone, one or more high index inorganic adhesives, or a sol-gel glass.

Figure 5:
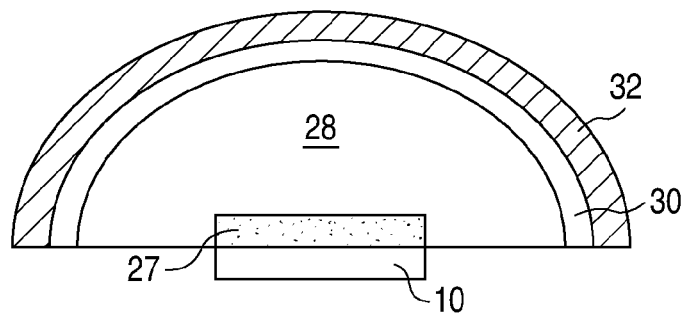
FIG. 5 illustrates a filter layer disposed over a lens disposed over a phosphor converted semiconductor light emitting device.

FIG. 5 illustrates a filter formed on a lens disposed over a wavelength-converted light emitting semiconductor structure. Any suitable semiconductor structure 10 and wavelength converting layer 27 are packaged in a package including a lens 30. A transparent material 28 such as silicone may be disposed in the space between lens 30 and semiconductor structure 10 and wavelength converting layer 27. Filter layer 32, which may include one or more of the filter materials described above, may be coated as shown in FIG. 5 on the exterior surface of lens 30, which may be glass, plastic, or any other suitable transparent material. Alternatively, filter layer 32 may be formed on the interior surface of lens 30, or particles of filter material may be mixed in the material used to form lens 30.

Figure 6:
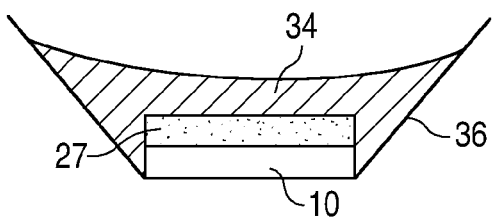
FIG. 6 illustrates a filter material disposed in an encapsulant disposed over a phosphor converted semiconductor light emitting device.

FIG. 6 illustrates a filter mixed in a transparent material coating a wavelength-converted light emitting semiconductor structure. Any suitable semiconductor structure 10 and wavelength converting layer 27 are placed in a package structure 36 such as a reflector cup or lead frame. Filter layer 34 includes one or more of the filter materials described above mixed with a transparent material and coated over semiconductor structure 10 and wavelength converting layer 27.

The filter layers illustrated in the examples shown in FIGS. 3-6 may be adjusted by adding additional material or removing material by ablation, as described above. In some embodiments, different wavelength converting materials formed in different configurations, and different filter materials formed in different configurations, may be combined in a single device.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
   a semiconductor structure including a light emitting region disposed between an n-type region and a p-type region, the light emitting region being configured to emit first light;
   a wavelength converting material disposed in a path of the first light, the wavelength converting material being configured to absorb a portion of the first light and emit second light; and
   a filter disposed in a path of the first light, the filter being configured to transmit a fraction of first light and absorb or reflect a fraction of first light at an intensity greater than a predetermined intensity;
   wherein the filter comprises one of a hydrothermal zinc-oxide crystal and a dendron decorated porphyrin.

2. The device of claim 1 wherein the semiconductor structure comprises a plurality of III-nitride layers.

3. The device of claim 1 wherein the first light comprises blue light and the second light comprises yellow light.

4. The device of claim 1 wherein the wavelength converting material comprises a phosphor.

5. The device of claim 1 further comprising a lens disposed over the semiconductor structure, wherein the filter is coated on a surface of the lens.

6. A method comprising:
   providing a semiconductor light emitting device configured to emit first light and a wavelength converting material disposed in a path of the first light configured to absorb a portion of the first light and emit second light;
   detecting a CCT of combined first and second light; and
   disposing a filter in a path of the first and second light, wherein the filter is configured to absorb or reflect one of a portion of the first light and a portion of the second light, and wherein a quantity or type of filter material disposed is determined based on the CCT detected.

* * * * *